(12) United States Patent
Zhang et al.

(10) Patent No.: US 11,335,577 B2
(45) Date of Patent: *May 17, 2022

(54) METHODS AND APPARATUS TO PREVENT INTERFERENCE BETWEEN PROCESSING CHAMBERS

(71) Applicant: Applied Materials, Inc., Santa Clara, CA (US)

(72) Inventors: Fuhong Zhang, San Jose, CA (US); Sunil Kumar Garg, Santa Clara, CA (US); Paul Kiely, Santa Cruz, CA (US); Martin Lee Riker, Milpitas, CA (US); William Fruchterman, Santa Clara, CA (US); Zheng Wang, Mountain View, CA (US); Xiaodong Wang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 137 days.

This patent is subject to a terminal disclaimer.

(21) Appl. No.: 16/592,084

(22) Filed: Oct. 3, 2019

(65) Prior Publication Data

US 2020/0035527 A1 Jan. 30, 2020

Related U.S. Application Data

(63) Continuation of application No. 15/718,336, filed on Sep. 28, 2017, now Pat. No. 10,438,828.
(Continued)

(51) Int. Cl.
*H01L 21/67* (2006.01)
*G05B 15/02* (2006.01)
*G05B 19/418* (2006.01)

(52) U.S. Cl.
CPC ........ *H01L 21/67276* (2013.01); *G05B 15/02* (2013.01); *G05B 19/41865* (2013.01); *G05B 2219/32275* (2013.01); *Y02P 90/02* (2015.11)

(58) Field of Classification Search
CPC ........ H01L 21/67276; G05B 19/41865; G05B 2219/32275
See application file for complete search history.

(56) References Cited

U.S. PATENT DOCUMENTS 5,925,212 A 7/1999 Rice et al.
6,293,291 B1 * 9/2001 Sperlich ............ H01L 21/67276
134/104.1
(Continued)

FOREIGN PATENT DOCUMENTS

CN 102223765 A 10/2011
CN 104094385 A 10/2014
(Continued)

OTHER PUBLICATIONS

PCT International Search Report and Written Opinion in PCT/US2017/054765 dated Jan. 8, 2018, 13 pages.

*Primary Examiner* — Vincent H Tran
(74) *Attorney, Agent, or Firm* — Servilla Whitney LLC

(57) ABSTRACT

Methods and apparatus to minimize electromagnetic interference between adjacent process chambers of a cluster tool are described. The start time of the subject recipe is controlled based on the electromagnetic process window of the subject process chamber, the electromagnetic window of the first adjacent process chamber and of an optional second adjacent process chamber. The start time of the subject process chamber is controlled to prevent temporal overlap of the electromagnetic window of the subject chamber with the electromagnetic window of an adjacent chamber.

11 Claims, 3 Drawing Sheets

Related U.S. Application Data

(60) Provisional application No. 62/403,692, filed on Oct. 3, 2016.

(56) References Cited

U.S. PATENT DOCUMENTS

| | | | |
|---|---|---|---|
| 9,257,265 B2 | 2/2016 | Garcia de Gorordo et al. | |
| 10,438,828 B2 * | 10/2019 | Zhang | G05B 19/41865 |
| 10,444,749 B2 * | 10/2019 | Pannese | H01L 21/67184 |
| 2001/0012971 A1 * | 8/2001 | Nguyen | H01L 21/67028 |
| | | | 700/121 |
| 2002/0127350 A1 | 9/2002 | Ishikawa et al. | |
| 2003/0230385 A1 | 12/2003 | Bach et al. | |
| 2006/0000800 A1 | 1/2006 | Usui et al. | |
| 2006/0223334 A1 * | 10/2006 | Saki | G05B 19/41865 |
| | | | 438/765 |
| 2007/0062449 A1 | 3/2007 | Mungekar et al. | |
| 2007/0254112 A1 * | 11/2007 | Takehara | B08B 7/0035 |
| | | | 427/569 |
| 2008/0149473 A1 | 6/2008 | Ajima | |
| 2008/0216077 A1 | 9/2008 | Emani et al. | |
| 2008/0220621 A1 | 9/2008 | Shinozaki et al. | |
| 2009/0214759 A1 | 8/2009 | Matsuoka et al. | |
| 2013/0020195 A1 | 1/2013 | Yamamoto et al. | |
| 2013/0202387 A1 | 8/2013 | Hiroki | |
| 2014/0188267 A1 | 7/2014 | Wakabayashi | |
| 2015/0290766 A1 | 10/2015 | Sugiyama et al. | |
| 2016/0013056 A1 | 1/2016 | Kasai et al. | |
| 2017/0092530 A1 | 3/2017 | Kaba et al. | |
| 2017/0160731 A1 * | 6/2017 | Yamanaka | H01H 43/04 |

FOREIGN PATENT DOCUMENTS

| | | | | |
|---|---|---|---|---|
| JP | 2003168090 A | * | 6/2003 | G01D 21/02 |
| JP | 2012213333 A | * | 11/2012 | C12M 23/10 |
| JP | 5750107 B2 | | 7/2015 | |
| TW | I455194 B | | 10/2014 | |
| TW | I541853 B | | 7/2016 | |
| WO | 2014116488 A1 | | 7/2014 | |

* cited by examiner

METHODS AND APPARATUS TO PREVENT INTERFERENCE BETWEEN PROCESSING CHAMBERS

CROSS-REFERENCE TO RELATED APPLICATIONS

This application is a continuation of United Stated patent application Ser. No. 15/718,336, filed Sep. 28, 2017, which claims priority to U.S. Provisional Application No. 62/403,692, filed Oct. 3, 2016, the entire disclosures of which are hereby incorporated by reference herein.

TECHNICAL FIELD

The present disclosure relates generally to apparatus and methods to prevent or minimize electromagnetic interference between adjacent processing chambers. In particular, the disclosure relates to apparatus and methods to minimize or eliminate electromagnetic or other process interference between adjacent processing chambers in a cluster tool using process recipe control.

BACKGROUND

Interference can happen for two adjacent processing chambers (e.g., physical vapor deposition (PVD) chambers). The magnetic field from one chamber can affect the magnetic field in an adjacent chamber, resulting in deposition rate, uniformity and/or deposition profile differences.

With the application or use of an electromagnet (EM), the EM current can generate a strong field, which can lead to the possibility of EM interference. With a small EM current, the generated magnetic field (B-field) can be small enough to not cause measurable or significant interference. An interlock can be set to ensure that the EM current/B-field is under a threshold value that does not cause interference. However, for processes using large electric currents, interference between adjacent chambers are observed and can be significant in impact.

Currently, magnetic shields are used to reduce interference; however, magnetic shields cannot eliminate interference. The effectiveness of B-shield materials are directly related to the thickness/volume of the material. To eliminate interference, the B-shield would be extraordinarily bulky, expensive and not serviceable.

Therefore, there is a need in the art for methods and apparatus to reduce or eliminate magnetic field interference.

SUMMARY

One or more embodiments of the disclosure are directed to methods of processing a substrate. A substrate is positioned within a subject process chamber, the subject process chamber having a first adjacent process chamber. A subject process recipe to be performed in the subject process chamber is loaded into a system controller. A first process recipe to be performed in the first adjacent process chamber is loaded into the system controller. The first process recipe is evaluated using the system controller to determine a first process window in which an electromagnet is powered in the first adjacent process chamber. A start time for the subject process recipe is determined using the system controller. The subject process chamber is started using the system controller to begin the subject process recipe at the start time.

Additional embodiments of the disclosure are directed to methods of processing a substrate. A substrate is positioned within a subject process chamber, the subject process chamber having a first adjacent process chamber and a second adjacent process chamber. A subject recipe, a first process recipe and a second process recipe is loaded into a system controller. The subject process recipe is to be performed in the subject process chamber, the first process recipe is to be performed in the first adjacent process chamber and the second recipe is to be performed in the second adjacent process chamber. The first process recipe, second process recipe and subject process recipe are evaluated using the system controller to determine one or more first electromagnetic field start times and end times, and one or more second electromagnetic field start times and end times, and one or more subject electromagnetic field start times and end times. A start time for the first recipe, second recipe and subject process recipe is determined using the system controller based on the first electromagnetic start time, first electromagnetic end time, second electromagnetic start time, second electromagnetic end time and subject electromagnetic start time and subject electromagnetic end time. The subject process chamber, the first adjacent process chamber and the second adjacent process chamber is controlled using the system controller to begin the subject process recipe, first process recipe and second process recipe at the start times determined by the system controller.

Further embodiments of the disclosure are directed to cluster tools comprising a cluster tool body with a first section and a second section. A first plurality of processing chambers are connected to a first central transfer chamber in the first section. A second plurality of processing chambers is connected to a second central transfer chamber in the second section. A first robot is in the first central transfer chamber. A second robot is in the second central transfer chamber. A system controller is in communication with the first robot, second robot, first plurality of processing chambers and second plurality of processing chambers. The system controller is configured to determine a subject recipe start time for a subject process chamber having a first adjacent process chamber and a second adjacent process chamber. The subject recipe start time is based on a first recipe to be performed in the first adjacent process chamber and a second recipe to be performed in the second adjacent process chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
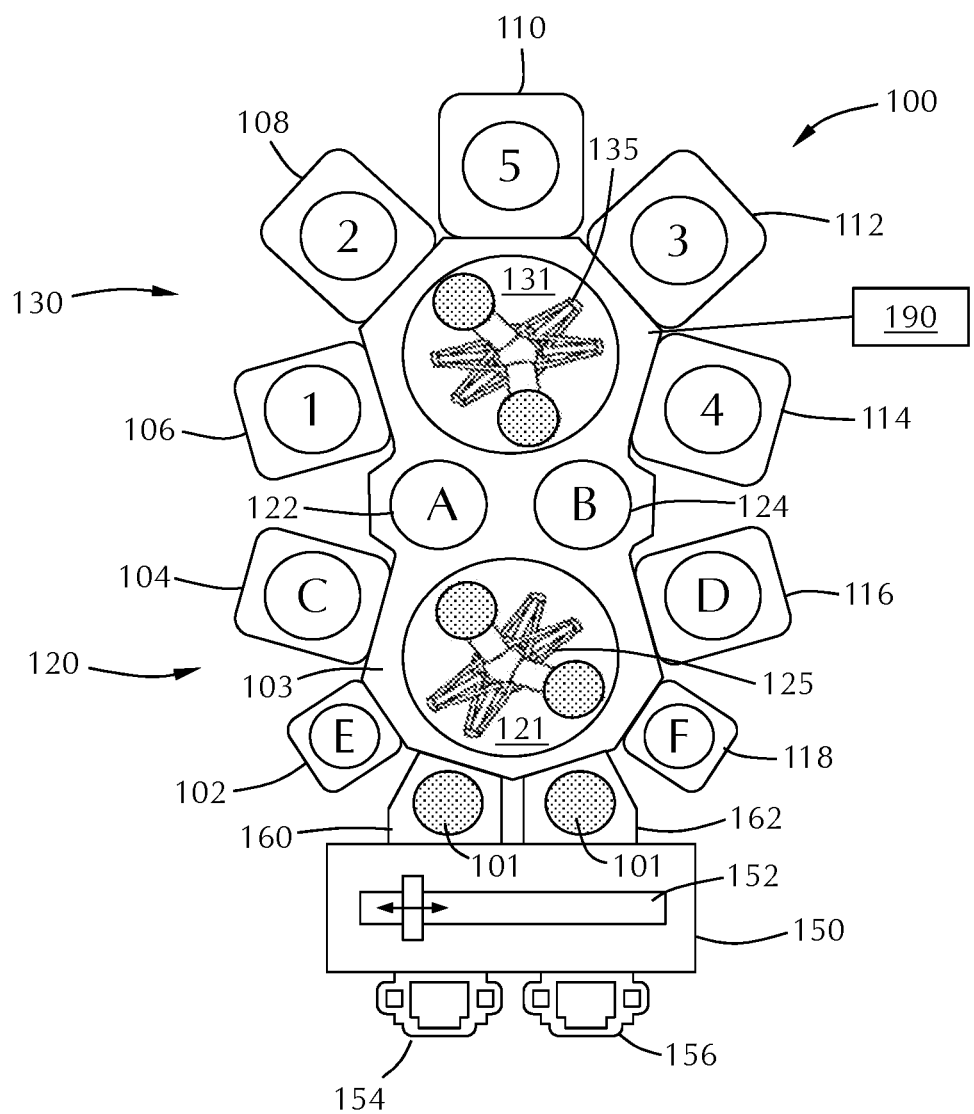
FIG. 1 shows a cluster tool in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Embodiments of the disclosure provide systems and methods to minimize or eliminate inter-chamber interference. In some embodiments, the interference is electromagnetic interference. In some embodiments, the interference includes non-electromagnetic interferences (e.g., process interference). In some embodiments, the process timing of adjacent chambers is controlled to prevent adjacent chambers from generating potentially interfering magnetic fields at the same time. As used in this manner, the term "adjacent chamber" refers to chambers that are physically next to each other and have process interference, and to chambers that are not physically next to each other but have process interference. For this purpose, process chambers that are next to each other and do not have process interference are not considered adjacent chambers.

In some embodiments, a system is used to "look ahead" for the timing of the electromagnetic currents on and off states prior to starting, or while running a process recipe in an adjacent chamber. As used in this regard, the term "process recipe" refers to the series of conditions used to process a substrate. The process conditions include, but are not limited to, gas pressure, gas flows, plasma generation and timing.

It has been found that wafers being processed in adjacent chambers of a cluster tool can be affected by magnetic fields generated in the adjacent chamber. The locations of the chambers around the cluster tool affect the degree of EM interference.

In some embodiments, before processing of a wafer in a particular chamber, the system looks at the recipe of adjacent chambers. The start time of processing can be changed so that the recipe in the adjacent chambers is at a point where there is no EM overlap.

FIG. 1 shows a schematic diagram of an illustrative multiple chamber semiconductor processing tool, also referred to as a cluster tool or multi-cluster tool. The cluster tool 100 comprises a plurality of processing chambers 102, 104, 106, 108, 110, 112, 114, 116, 118. The various processing chambers can be any suitable chamber including, but not limited to, a preclean chamber, a buffer chamber, transfer space(s), a wafer orienter/degas chamber, a cooldown chamber, and a transfer chamber. The particular arrangement of process chambers and components can be varied depending on the cluster tool and should not be taken as limiting the scope of the disclosure.

In the embodiment shown in FIG. 1, a factory interface 150 is connected to a front of the cluster tool 100. The factory interface 150 includes a loading chamber 154 and an unloading chamber 156 on a front 151 of the factory interface 150. While the loading chamber 154 is shown on the left and the unloading chamber 156 is shown on the right, those skilled in the art will understand that this is merely representative of one possible configuration.

The size and shape of the loading chamber 154 and unloading chamber 156 can vary depending on, for example, the substrates being processed in the cluster tool 100. In the embodiment shown, the loading chamber 154 and unloading chamber 156 are sized to hold a wafer cassette with a plurality of wafers positioned within the cassette.

A robot 152 is within the factory interface 150 and can move between the loading chamber 154 and the unloading chamber 156. The robot 152 is capable of transferring a wafer from a cassette in the loading chamber 154 through the factory interface 150 to load lock chamber 160. The robot 152 is also capable of transferring a wafer from the load lock chamber 162 through the factory interface 150 to a cassette in the unloading chamber 156. As will be understood by those skilled in the art, the factory interface 150 can have more than one robot 152. For example, the factory interface 150 may have a first robot that transfers wafers between the loading chamber 154 and load lock chamber 160, and a second robot that transfers wafers between the load lock 162 and the unloading chamber 156.

The cluster tool 100 shown has a first section 120 and a second section 130. The first section 120 is connected to the factory interface 150 through load lock chambers 160, 162. The first section 120 includes a first transfer chamber 121 with at least one robot 125 positioned therein. The robot 125 is also referred to as a robotic wafer transport mechanism. The first transfer chamber 121 is centrally located with respect to the load lock chambers 160, 162, process chambers 102, 104, 116, 118 and buffer chambers 122, 124. The robot 125 of some embodiments is a multi-arm robot capable of independently moving more than one wafer at a time. In some embodiments, the first transfer chamber 121 comprises more than one robotic wafer transfer mechanism. The robot 125 in first transfer chamber 121 is configured to move wafers between the chambers around the first transfer chamber 121. Individual wafers are carried upon a wafer transport blade that is located at a distal end of the first robotic mechanism.

After processing a wafer in the first section 120, the wafer can be passed to the second section 130 through a pass-through chamber. For example, chambers 122, 124 can be uni-directional or bi-directional pass-through chambers. The pass-through chambers 122, 124 can be used, for example, to preclean or preheat the wafer before processing in the second section 130, or allow wafer cooling or post-processing before moving back to the first section 120.

One or more embodiments of the disclosure are directed to cluster tools 100. The cluster tool 100 comprises a body 103 with a first section 120 and a second section 130. The first section 120 includes a first central transfer chamber 121 and a first plurality of processing chambers 102, 104, 116, 118. Each of the first plurality of processing chambers is connected to the first central transfer chamber 121 and is accessible by a first robot 125 located in the first central transfer chamber 121. The second section 130 includes a second central transfer chamber 131 and a second plurality of processing chambers 106, 108, 110, 112, 114. Each of the second plurality of processing chambers is connected to the second central transfer chamber 131 and is accessible by a second robot 135 located in the second central transfer chamber 131.

A system controller 190 is in communication with the first robot 125, second robot 135, first plurality of processing chambers 102, 104, 116, 118 and second plurality of processing chambers 106, 108, 110, 112, 114. The system controller 190 can be any suitable component that can control the processing chambers and robots. For example, the system controller 190 can be a computer including a central processing unit, memory, suitable circuits and storage.

The system controller 190 of various embodiments is configured to determine a subject recipe start time for a subject process chamber. The subject process chamber, for example, chamber 106 can have a first adjacent process chamber 108 and a second adjacent process chamber 104 on a different side than the first adjacent process chamber 108. Those skilled in the art will understand that the example chambers referred to in this specification are for descriptive purposes and should not be taken as limiting the scope of the disclosure.

The system controller 190 loads or is programmed with a subject recipe that will be performed in the subject process chamber, a first recipe that will be performed in the first adjacent process chamber and a second recipe that will be performed in the second adjacent process chamber. For example, if the subject recipe is to be performed in chamber 106, the first adjacent chamber 108 and/or second adjacent chamber 104 may create electromagnetic interference during the subject recipe.

The location of the subject process chamber and the adjacent process chambers can vary. In some embodiments, the subject process chamber and the first adjacent process chamber are connected to the first central transfer chamber 121 or the second central transfer chamber 131. In some embodiments, the second adjacent process chamber is connected to the same central transfer chamber or a different central transfer chamber as the subject process chamber and the first adjacent process chamber.

In some embodiments, the subject process chamber and the first adjacent process chamber are connected to different central transfer chambers. In one or more embodiments, there is no second adjacent process chamber or the second adjacent process chamber does not perform a recipe that might create electromagnetic interference with the subject process chamber.

The system controller 190 evaluates that process recipes to determined process windows in which an electromagnet is powered or in which electromagnetic interference can occur. The process window is defined as the time period between and including the time that the electromagnet power is turned on to the time at which the electromagnet power is turned off.

Figure 2:
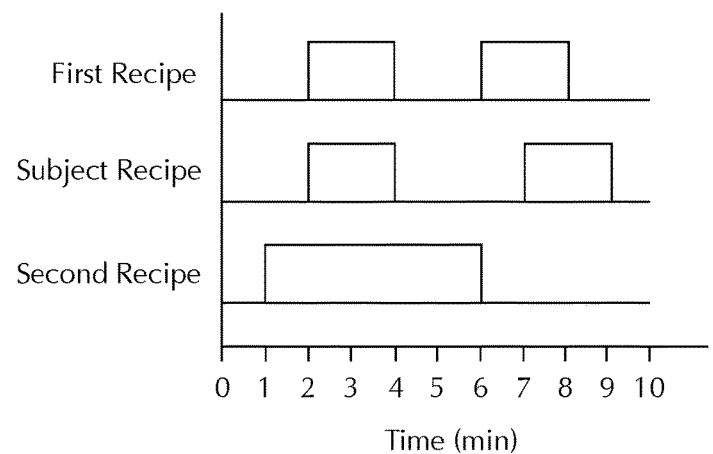
FIG. 2 shows graphical representations of example process recipes in accordance with one or more embodiment of the disclosure.

For descriptive purposes only, three process recipes are listed in Table 1 below. These process recipes will be used to describe the various embodiments of the disclosure; however, those skilled in the art will understand that the disclosure is not limited to these process recipes. FIG. 2 shows a graphical representation of the process recipes listed in Table 1.

TABLE 1

Electromagnet Power During Process Recipe

| Process Time (min) | First Recipe | Subject Recipe | Second Recipe |
|---|---|---|---|
| 1 | Off | Off | Off |
| 2 | Off | Off | On |
| 3 | On | On | On |
| 4 | On | On | On |
| 5 | Off | Off | On |
| 6 | Off | Off | On |
| 7 | On | Off | Off |
| 8 | On | On | — |
| 9 | Off | On | — |
| 10 | — | Off | — |

In some embodiments, the system controller evaluates the first process recipe to determine one or more process windows in which an electromagnet is powered. In the embodiment shown, there are two process windows in which electromagnet power is engaged; from 2-4 minutes and from 6-8 minutes. There can be any number of process windows in which an electromagnet is powered during any recipe.

The system controller also evaluates the subject process recipe to determine one or more process windows in which an electromagnet is powered. In the embodiment shown, there are two process windows in which electromagnet power is engaged; from 2-4 minutes and from 7-9 minutes. There can be any number of process windows in which an electromagnet is powered during any recipe.

As can be seen from the example subject recipe and first recipe, there would be overlap of the magnetic fields generated due to the electromagnet power. The overlap would occur at 2-4 minutes and at 7-8 minutes. This overlap of magnetic fields can cause deviations in the magnetic field and current observed by the substrates being exposed to the first process recipe and the subject process recipe. Therefore, the system controller determines a start time for each of the process recipes to ensure that there is only one electromagnet powered for each of the relevant process chambers.

Figure 3:
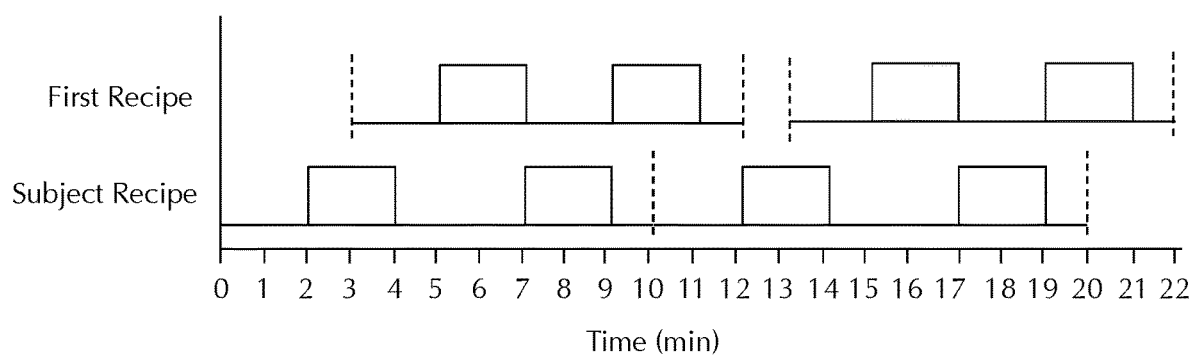
FIG. 3 shows a graphical representation of process recipes in accordance with one or more embodiment of the disclosure.

As an example, the subject process chamber running the subject recipe has a single potentially interfering adjacent chamber running the first recipe. As shown in FIG. 3, offsetting the start time of the first recipe by five minutes would result in no overlap of the magnetic fields in the subject process chamber and the first adjacent process chamber. Additionally, the subject recipe can repeat without delay between each cycle, while the first recipe can repeat with a one minute interval between the end of the each cycle and the start of a subsequent cycle.

Thus, the start time is determined so that there is no temporal overlap of electromagnetic field generation in the subject process chamber with the first process window. The system controller can then start both the first recipe in the first adjacent chamber and the subject recipe in the subject chamber.

In some embodiments, the subject process chamber has a second adjacent process chamber on a different side of the subject process chamber than the first adjacent process chamber. The second adjacent process chamber can also have some interference with the magnetic field generated in the subject process chamber. In some embodiments, the first adjacent chamber and the second adjacent chamber are on different sides of the subject chamber so that there is little or no potential interference between the process recipes in the first adjacent chamber and the second adjacent chamber.

In some embodiments, the system controller loads the second process recipe to be performed in the second adjacent process chamber and evaluates the second process recipe to determine a second process window in which an electromagnet is powered in the second adjacent process chamber.

Figure 4:
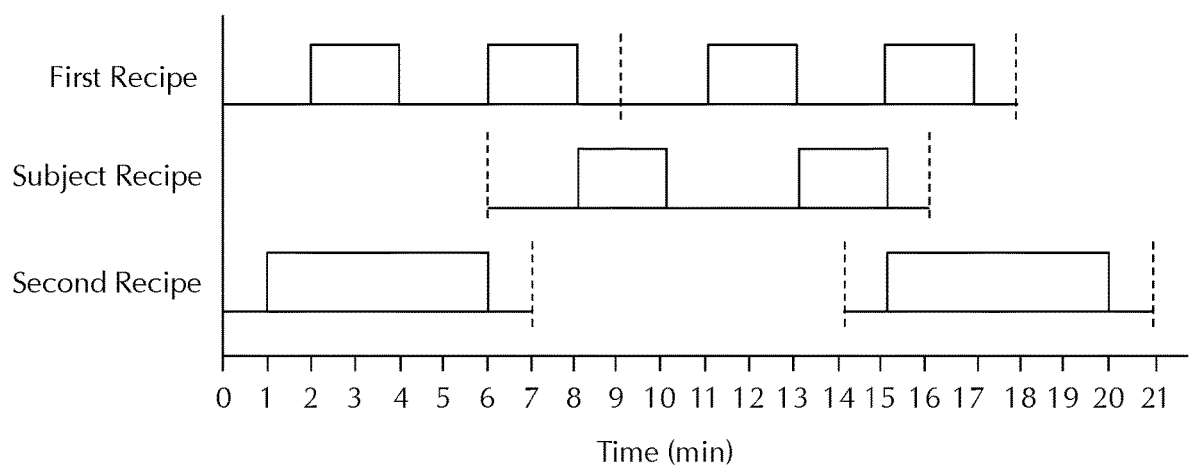
FIG. 4 shows graphical representations of process recipes in accordance with one or more embodiment of the disclosure.

The system controller can then determine the start time for the subject process recipe by evaluating the first process window(s) from the first adjacent processing chamber and the second process window(s) from the second adjacent processing chamber. For example, as shown in FIG. 4, the first and second adjacent process chamber recipes can be started at the same time and the onset of the subject recipe is delayed for six minutes. The cycling of the first recipe and the second recipe and the subject recipe can be altered so there is a delay period between each cycle to allow concurrent processing without temporal overlap of electromagnetic field generation in the subject process chamber with the first process window or the second process window.

The system controller determines a first start time for the first adjacent process chamber and a second start time for the second adjacent process chamber based on the subject process recipe and starts the first process recipe in the first adjacent process chamber and the second process recipe in the second adjacent process chamber.

Stated differently, the system controller of some embodiments evaluates the first process recipe, second process recipe and subject process recipe to determine one or more first electromagnetic field start times and end times for the first recipe, and one or more second electromagnetic field start times and end times for the second recipe, and one or more subject electromagnetic field start times and end times for the subject recipe. The start time for the first recipe, second recipe and subject process recipe are can be determined using the system controller based on the first electromagnetic start time, first electromagnetic end time, second electromagnetic start time, second electromagnetic end time and subject electromagnetic start time and subject electromagnetic end time.

In some embodiments, the first adjacent process chamber and the second adjacent process chamber are started at a time so that there is no temporal overlap when an electromagnet is powered in the subject process chamber based on the subject process recipe.

In one or more embodiments, one of the first adjacent process chamber and the second adjacent process chamber is connected to the same central transfer chamber as the subject process chamber.

In some embodiments, both the first adjacent process chamber and the second adjacent process chamber are connected to the same central transfer chamber as the subject process chamber.

In one or more embodiments, the subject process chamber and the first adjacent process chamber are connected to the same central transfer chamber. In some embodiments, the subject process chamber and the first adjacent process chamber are connected to different central transfer chambers.

controlling the subject process chamber, the first adjacent process chamber and the second adjacent process chamber using the system controller to begin the subject process recipe, first process recipe and second process recipe at the start times determined by the system controller.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing chamber system controller configured to determine a start time for
    a subject process recipe in a subject process chamber, the subject process recipe having a subject process window in which an electromagnet is powered in the subject process chamber; and
    a first process recipe in a first adjacent process chamber to the subject process chamber, the first process recipe having a first process window in which an electromagnet is powered in the first adjacent process chamber,
    wherein the start time of the subject process recipe prevents temporal overlap of the subject process window in the subject process recipe in the subject process chamber with the first process window in the first process recipe in the first adjacent process chamber,
    wherein the system controller is operatively connected to one or more of the subject process chambers, the first adjacent process chamber, or the second adjacent process chamber, and
    wherein the system controller is further configured to control the subject process chamber to begin the subject process recipe at the determined start time.

2. The processing chamber system controller of claim 1, further configured to control the first adjacent process chamber to begin the first process recipe at the determined start time.

3. The processing chamber system controller of claim 1, further configured to determine a start time of a second process recipe in a second adjacent process chamber to the subject process chamber, the second process recipe having a second process window in which an electromagnet is powered in the second adjacent process chamber.

4. The processing chamber system controller of claim 3, wherein the start time of the subject process recipe is determined so that there is no temporal overlap of electromagnetic field generation in the subject process chamber with the first process window or the second process window.

5. The processing chamber system controller of claim 3, further configured to control the subject process chamber to begin the subject process recipe at the determined start time.

6. The processing chamber system controller of claim 5, further configured to control a first robot in a first central transfer chamber of a cluster tool to move a substrate into and out of the subject process chamber.

7. The processing chamber system controller of claim 6, further configured to control one of a first robot in a first central transfer chamber into and out of the first adjacent process chamber when the first adjacent process chamber is connected to the first central transfer chamber, or a configuration to control a second robot in a second central transfer chamber of a cluster tool to move a substrate into and out of the first adjacent process chamber when the first adjacent process chamber is connected to the second central transfer station.

8. The processing chamber system controller of claim 5, further configured to control the first adjacent process chamber to begin the first process recipe at the determined start time.

9. The processing chamber system controller of claim 5, further configured to control the second adjacent process chamber to begin the second process recipe at the determined start time.

10. The processing chamber system controller of claim 5, further configured to control a second robot in a second central transfer chamber of a cluster tool to move a substrate into and out of the second adjacent process chamber.

11. A processing chamber system controller, configured to determine a start time of:
- a first process recipe in a first adjacent process chamber, the first process recipe having a first process window in which an electromagnet is powered in the first adjacent process chamber;
- a second process recipe in a second adjacent process chamber, the second process recipe having a second process window in which an electromagnet is powered in the second adjacent process chamber; and
- a subject process recipe in a subject process chamber, the subject process recipe having a subject process window in which an electromagnet is powered in the subject process chamber, the start time of the subject process recipe prevents temporal overlap of the subject process window with the first process window of the second process window, wherein the system controller is operatively connected to one or more of the subject processing chambers, the first adjacent processing chamber, the second adjacent processing chamber, a first robot in a first central transfer station or a second robot in a second central transfer station, and wherein the system controller is further configured to control the subject process chamber to begin the subject process recipe at the determined start time.

* * * * *